United States Patent [19]
Cudak et al.

[11] Patent Number: 5,218,621
[45] Date of Patent: Jun. 8, 1993

[54] ADAPTIVE DIGITAL EQUALIZATION FILTER

[75] Inventors: Mark C. Cudak, Mount Prospect; Bradley M. Hiben, Glen Ellyn; Robert D. Lo Galbo, Addison, all of Ill.

[73] Assignee: Motorola, Inc., Schaumburg, Ill.

[21] Appl. No.: 680,460

[22] Filed: Apr. 4, 1991

[51] Int. Cl.⁵ .............................................. H03H 7/30
[52] U.S. Cl. ..................................... 375/11; 375/103; 364/724.01
[58] Field of Search .................. 333/18, 28 R; 375/11, 375/12, 14, 96, 103; 364/724.01

[56] References Cited
U.S. PATENT DOCUMENTS

| | | | |
|---|---|---|---|
| 4,333,063 | 6/1982 | Ryu et al. | 333/18 |
| 4,361,892 | 11/1982 | Martin | 375/14 |
| 4,686,686 | 8/1987 | Nakayama et al. | 375/11 |

Primary Examiner—Curtis Kuntz
Assistant Examiner—Vijay Shankar
Attorney, Agent, or Firm—Wayne J. Egan

[57] ABSTRACT

An adaptive digital equalization filter is provided to remedy the differential time delay problem in a digital simulcast system. The digital simulcast system includes an adaptive digital equalization filter with N coefficients, and a fixed analog anti-alias filter. According to the invention, the adaptive digital equalization filter first measures the amount of delay contributed to the output signal by the fixed anti-alias filter. This is accomplished by exciting the anti-alias filter with a unit impulse, and measuring the resulting impulse response. The adaptive filter next determines the characteristics needed to compensate for the amount of measured delay contributed to the output signal by the fixed filter. This is accomplished by computing a new set of N coefficients using the Levinson-Durbin algorithm. The adaptive filter next adjusts its coefficients based on these determined characteristics. Further, the adaptive filter periodically determines when it is time to update the N coefficients.

31 Claims, 2 Drawing Sheets

ADAPTIVE DIGITAL EQUALIZATION FILTER

TECHNICAL FIELD

This application relates to dynamic delay equalization of anti-alias filters for digital simulcast systems.

BACKGROUND OF THE INVENTION

In simulcast systems it is important that identical modulating signals are produced at each transmitter site. Differential delays as small as tens of microseconds between the signals can significantly reduce coverage. As is known, a digital signal processor (hereinafter "DSP") may be used to produce the modulating signals at the sites. Digital technology creates identical digital signals at each site. However, a new problem is created by this method. In order to interact with the analog world, the digital filter must pass through a digital to analog (hereinafter "D/A") converter and anti-alias filter. The latter device is an analog device which is subject to the tolerances of the components used in manufacturing. Using 5% tolerance components can produce as much as 20 micro-seconds of delay in a 5-pole 10-kHz filter.

There are several obvious solutions with significant costs attached. One solution is to use more expensive parts with higher tolerances to reach the desired specifications. Another solution is to use a wider anti-alias filter and increase the sampling rate. The higher sampling rate would increase the loading on the DSP and reduce available processing capacity for other features.

In the manufacture of analog devices such as filters, there is always a margin of error in the performance as a result of tolerances in the manufacturing process. In a simulcast system, this margin of error can significantly reduce the coverage area. The invention disclosed herein allows exact digital technology to compensate for the error introduced by an analog device.

The concept of digitally reconstructing the modulation signals at the remote sites is a new concept and therefore the problem of differential delay has not been previously encountered. In past systems the modulating signal would be created at the central site and transmitted over wide-band communication lines. However, adaptive filter are often used in modems where they equalize the distortion induced in the communication link. In the modem application, a predetermined training sequence is sent prior to a data transmission by the source. The receiver calculates the distortion induced by the communication link and adapts accordingly.

In all digital systems, a D/A converter must be followed by a recovery filter and an analog to digital (hereinafter "A/D") converter must be preceded by an anti-alias filter to guarantee basic laws of the signal processing are satisfied. The key circuit improvement of this invention is the use of the anti-alias filter for both analog recovery and analog sampling. This dual role is allowed since the sample clock and recovery clock are running at the same frequency. The use of DSP's such as the Motorola model 56000 aid this invention by making the implementation of the adaptive algorithm relatively effortless.

SUMMARY OF THE INVENTION

To remedy the differential delay problem, an adaptive digital equalization filter, according to the invention, is disclosed. The adaptive digital equalization filter is able to measure the response of the fixed analog anti-alias filter and adjust its own characteristics so that the overall response (transmitter site output signal to input signal) has the desired characteristic.

Briefly, the adaptive digital equalization filter, according to the invention, includes N coefficients that may be adjusted. According to the invention, the adaptive digital equalization filter first measures the amount of delay contributed to the output signal by the fixed anti-alias filter. This is accomplished by exciting the anti-alias filter with a unit impulse, and measuring the resulting impulse response. The adaptive filter next determines the characteristics needed to compensate for the amount of measured delay contributed to the output signal by the fixed filter. This is accomplished by computing a new set of N coefficients using the Levinson-Durbin algorithm. The adaptive filter next adjusts its coefficients based on these determined characteristics. Further, the adaptive filter periodically determines when it is time to update the N coefficients.

DETAILED DESCRIPTION OF THE INVENTION

Figure 1:
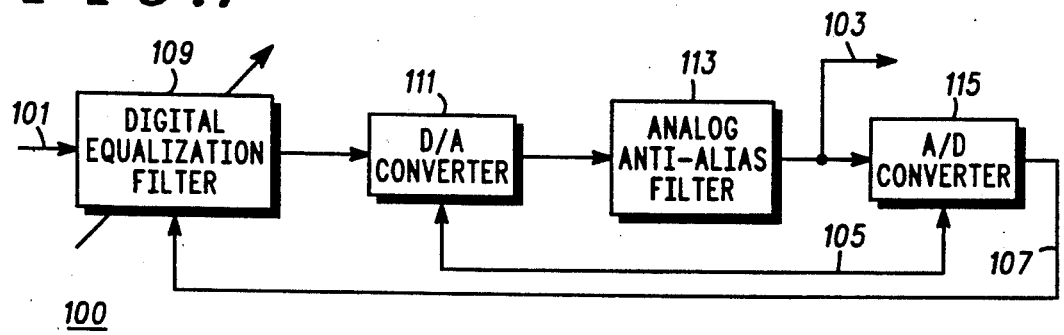
FIG. 1 is a block diagram that shows a digital simulcast system transmitter site including a first embodiment of an adaptive digital equalization filter, according to the invention.

Referring now to FIG. 1, there is shown a digital simulcast system transmitter site 100 including a first embodiment 109 of an adaptive digital equalization filter, according to the invention. There is shown a transmitter site input signal 101 coupled to the adaptive digital equalization filter 109. The output of filter 109, in turn, is coupled to D/A converter 111. The output of D/A converter 111, in turn, is coupled to analog anti-alias filter 113. The analog anti-alias filter 113, provides the transmitter site output signal 103.

As shown, the D/A converter 111 and analog to digital (hereinafter "A/D") converter 115 share a synchronous sampling and recovery clock 105 so that an accurate delay measure may be established. Furthermore, the adaptive process only needs to be performed on power-up. Once the response is equalized, the digital filter coefficients may remain static and signal processor loading is thus minimized. Similarly, a system which is continually operating may be equalized on a periodic basis to compensate for component aging.

Notice the transmitter site output signal 103 is returned (or fed-back) to the digital equalization filter 109 via A/D converter 115 and feedback path 107.

In order to deduce an algorithm for the dynamic delay equalization circuit in FIG. 1, the diagram must be translated into a mathematical representation. The Z-transform domain is a convenient means for analyzing digital circuits and applies to this particular problem quite easily. Because the system is digital and analog, it is more accurately represented using a combination of the Z-transform and Laplace transform. However, since the DSP operates strictly in the digital world, it is sufficient to represent the system in the Z-domain for analysis purposes.

Figure 2:
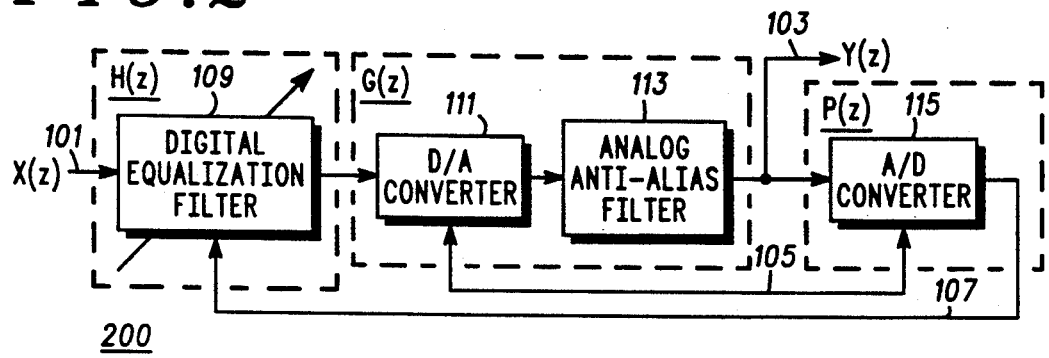
FIG. 2 is a second depiction of the first embodiment.

FIG. 2 shows the physical devices grouped and transfer functions assigned. The digital simulcast input 101 becomes X(z); the analog output 103 becomes Y(z); the combination of the D/A converter 111 and the analog anti-alias filter 113 become G(z); and the A/D converter 115 becomes P(z).

Figure 3:
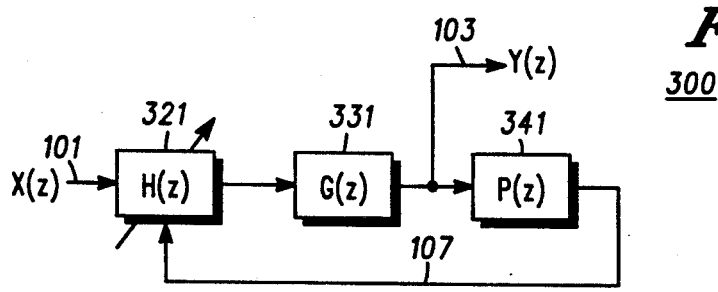
FIG. 3 is a third depiction of the first embodiment.

FIG. 3 represents the circuit of FIG. 2 in the Z-domain, which may now be analyzed mathematically. To further simplify the problem, several mathematical assumptions may be made based on the physical characteristics of the electrical devices. The A/D converter 115 is a digital device and therefore adds little amplitude or phase distortion. Therefore, the A/D converter 115's representation can be considered unity, thus, P(z)=1.

Figure 4:
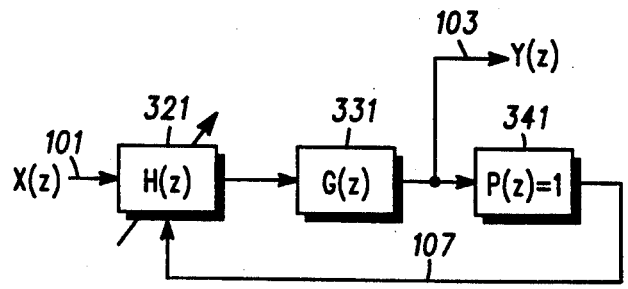
FIG. 4 is a fourth depiction of the first embodiment.
Figure 5:
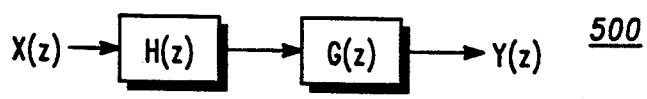
FIG. 5 is a first representation of a signal processing problem.

FIG. 4, illustrates the changes to FIG. 3 induced by this assumption. Furthermore, the analog anti-alias filter 113 component of G(z) varies slowly with time and therefore may be considered static during the analysis period. Since the anti-alias filter 113 is considered static, the optimum equalization filter 109, H(z), can also be considered static. The feedback path 107 can be used to measure the transfer function G(z) if H(z) is set equal to unity. Therefore, the transfer function G(z) can be considered aprior knowledge and the feedback path 107 can be ignored. A final Z-transform representation is illustrated in FIG. 5. The equivalent time-domain representation is depicted in FIG. 6.

Figure 6:
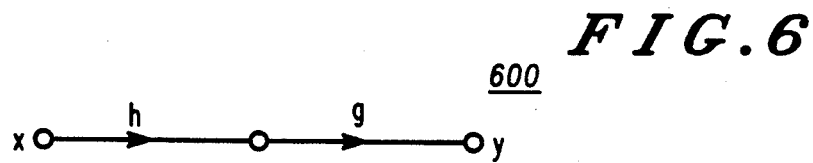
FIG. 6 is a second representation of a signal processing problem.

FIGS. 5 and 6 are equivalent representations of the classic signal processing problem often referred to as the "Whitening Problem." It is desired that the product of the transfer function or equivalently the convolution of the impulse responses be equal to a predetermined desired transfer function or impulse response. In mathematical terms, $$H(z)G(z) = D(z)$$

$$h*g = d$$

where D(z) and d represent the transfer function and impulse response of the desired signal respectively.

For the equalization problem, D(z) should be equal to the response of the ideal anti-alias filter with a fixed delay. If the impulse response of the ideal filter were i(t), the desired filter impulse response should be $$d(n) = \begin{cases} i(nT - t) & M > n > 0 \\ 0 & \text{otherwise} \end{cases}$$

where
M is the length of the desired impulse response
T is the sampling interval, and
t is a fixed delay.

Now, since g and d are known, the problem can be stated as minimize $$V(h) = ||d - g*h||.$$

In other words, minimize the mean squared error between desired ideal analog filter impulse response, d, and the convolution of the imperfect analog response, g, with the digital equalization filter, h. This is a least squares minimization problem whose solution is $$Rh = q \tag{1}$$

where $$R \begin{bmatrix} r(0) & r(1) & r(2) & - & r(N-1) & r(N) \\ r(1) & - & - & - & - & r(N-1) \\ r(2) & - & - & - & - & - \\ - & - & - & - & - & r(2) \\ r(N-1) & - & - & - & - & r(1) \\ r(N) & r(N-1) & - & r(2) & r(1) & r(0) \end{bmatrix}$$

and $$r(n) = \sum_{k=0}^{+\infty} g(n+k)g(k) \tag{2}$$

and
$$q = [q(0), q(1), \ldots, q(N)]^T$$

$$q(n) = \sum_{k=0}^{+\infty} d(n+k)g(k) \tag{3}$$

$$h = [h(0), h(1), \ldots, h(N)]^T$$

The matrix R and the vector q can be calculated using the equations given above since g(n) and d(n) are known. Solving for h and therefore h(n) gives $$h = R^{-1}q$$

It is often impractical to calculate the inverse of the matrix R due to its dimensions. Therefore, the recursive algorithm developed by Levison-Durbin should be used to solve equation (1) when implemented in a DSP. See, for example, the text "Digital Signal Processing," by Richard A. Roberts and Clifford T. Mullis.

To define the algorithm, the processing can be broken up into two modes, the update mode and steady-state mode. In the update mode, the processor will turn the feedback A/D on, measure the impulse response g(n), calculate the filter coefficients h(n), and then update the filter coefficients h(n). In the steady-state mode, the feedback is turned off and the h(n) filter coefficients remain static. The steady-state mode could be considered the normal mode of operation while the update mode would be run infrequently to compensate for the slowly varying filter.

Figure 7:
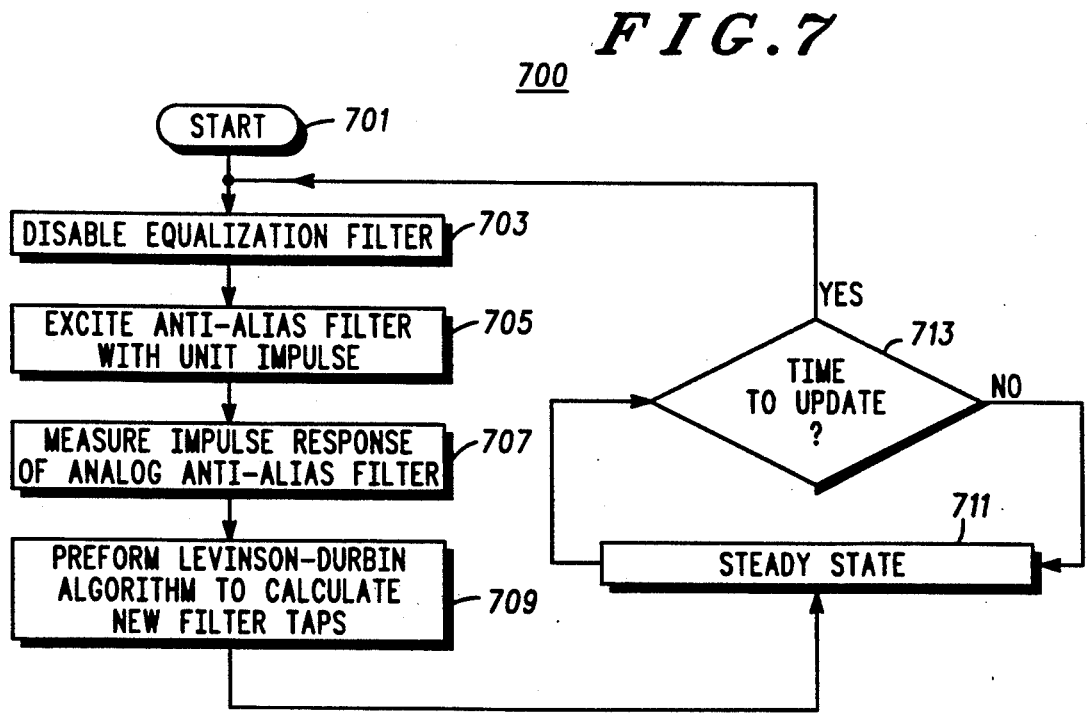
FIG. 7 is a first embodiment for an adaptive digital equalization filter method, according to the invention.

The update mode, as depicted in FIG. 7, comprises the following steps:

First, in step 703, the analog anti-alias filter 113 must be isolated so that it can be measured. To do this, the feedback A/D converter 115 is enabled and the digital equalization filter 109 is disabled by setting it equal to a unit impulse, $$h(n) = \delta(n)$$

where $$\delta(n) = \begin{cases} 1 & n = 0 \\ 0 & \text{otherwise} \end{cases}$$

Next, in step 705, the analog filter is measured by exciting the system with a unit impulse response, $$x(n) = \delta(n)$$

Next, in step 707, the output response of the filter, $y(n)$, is equivalent to the impulse response of the filter. The output should be measured for a fixed number of output samples, M, where M is determined by the complexity of the analog filter and the magnitude of the equalization constraints. Now, $$g(n) = \begin{cases} y(n) & M > n > 0 \\ 0 & \text{otherwise} \end{cases}$$

Next, in step 709, since $g(n)$ is known and $d(n)$ is predetermined, enough information is available to compute the Levinson-Durbin algorithm using the following steps:

i) Choose N large enough to satisfy the operating range of the anti-alias filter 113. N is the length of the equalization filter 109. This is computed off-line and fixed for a given system.

ii) Compute $r(n)$ and $q(n)$ as defined by equations designated (2) and (3), above.

iii) Set initial constraints for the algorithm $$a_0(0) = 1,$$
$$\alpha = r(0),$$
$$h(0) = \frac{q(0)}{r(0)}$$

iv) Perform the Levinson-Durbin recursion (expressed in pseudo code)

```
For i = 1 to N do
begin
a_i(i - 1) = 0
a_0(i) = 1
```

$$\beta = \frac{\left(\sum_{j=0}^{i-1} r(k-i)a_j(i-1)\right)}{\alpha}$$

```
For j = 1 to i do
begin
a_j(i) = a_j(i - 1) - βa_{i-j}(i-1)
end
α = α(1 - β²)
```

$$h(i) = \frac{q(i) - \left(\sum_{j=0}^{i-1} r(k-1)h(i)\right)}{\alpha}$$

```
For j = 1 to i - 1 do
begin
h(j) = h(j) + a_{k-j}(k)h(k)
end
end
```

In step 711, $h(n)$ calculated becomes the new coefficients of the digital filter 109, and the processor enters the steady-state mode, step 711.

In step 713, the process determines whether it is time to update the coefficients of the digital filter 109. If the determination is affirmative, the process proceeds to step 703. If the determination is negative, the process returns to step 711, steady-state.

It will be apparent to those skilled in the art that an adaptive digital equalization filter, according to the invention, may be embodied, in whole or in part, by software. In particular, with reference to FIG. 1, it is apparent the first embodiment of an adaptive digital equalization filter, designated 109, may be embodied, in whole or in part, by a software program or algorithm resident in processor. Such a processor may be, for example, a digital signal processor ("DSP"). One example of a processor that may be utilized for this purpose is the DSP56000, available from Motorola, Inc.

Those skilled in the art will further appreciate that an adaptive digital equalization filter method, according to the invention, may be embodied, in whole or in part, by software. In particular, with reference to FIG. 7, it is apparent the first embodiment of an adaptive digital equalization filter method, designated 700, may be embodied, in whole or in part, by a software program or algorithm.

Those skilled in the art will appreciate that the teachings of the present invention may find application in any situation wherein there is a signal that is dependent on a first element and on a second element, the first element having transmission parameters that may be selectively adjusted, and wherein it is desirable to adjust the first element in such a manner as to achieve a desired amount of time delay in the signal in accordance with the following steps:

first, measuring the amount of time delay contributed to the signal by the second element;

second, computing the values of the transmission parameters of the first element necessary to off-set or compensate for the amount of time delay so measured, as in the first step; and, third, setting the transmission parameters of the first element based on the values so computed, as in the second step.

An adaptive digital equalization filter, according to the invention, will find application in any digital system requiring a narrow recovery filter frequency response in conjunction with a fixed delay.

While various embodiments of an adaptive digital equalization filter, according to the invention, have been described hereinabove, the scope of the invention is defined by the following claims.

What is claimed is:

1. In a communication system having an input signal and an output signal, and wherein the output signal is based on the transmission parameters of a first filter and a second filter, the first filter including a digital equalization filter having N coefficients that may be adjusted, a method for adjusting the first filter to achieve a predetermined amount of time delay in the output signal, the method comprising the following steps:

(a) measuring the amount of time delay contributed to the output signal by the second filter;

(b) determining the transmission parameters of the first filter needed to compensate for the amount of time delay contributed to the output signal by the second filter, as measured in step (a);

(c) adjusting the N coefficients of the first filter based on the transmission parameters, as determined in step (b).

2. The method of claim 1, wherein the second filter includes an analog anti-alias filter.

3. The method of claim 2, wherein the communication system includes a digital simulcast system.

4. The method of claim 3, wherein the measuring step (a) includes a step (a1) of exciting the anti-alias filter with a unit impulse.

5. The method of claim 4, wherein the measuring step (a) includes a step (a2) of measuring the impulse response of the anti-alias filter.

6. The method of claim 5, wherein the determining step (b) includes a step of computing a new set of N coefficients for the digital equalization filter using the Levinson-Durbin algorithm.

7. The method of claim 6, including a further step of:
(d) determining when it is time to update the N coefficients.

8. The method of claim 7 including a further step of, based on the outcome of the further determining step (d), repeating the measuring step (a), the determining step (b), and the adjusting step (c).

9. The method of claim 8, wherein the method is performed using a digital signal processor (DSP).

10. The method of claim 9, wherein the second filter is fixed in the sense that it does not have transmission parameters that may be selectively adjusted.

11. A communication system having an input and an output, and wherein the output is based on the transmission characteristics of a first filter having transmission characteristics that may be selectively controlled and a second filter, the communication system including means for selectively controlling the first filter to achieve a desired amount of delay in the output, comprising:
means for measuring the amount of delay contributed to the output by the second filter;
means responsive to said measuring means for determining the characteristics of the first filter needed to compensate for the amount of delay contributed to the output by the second filter;
means responsive to said determining means for controlling the first filter.

12. The communication system of claim 11, wherein the first filter includes a digital equalization filter.

13. The communication system of claim 12, wherein the second filter includes an analog anti-alias filter.

14. The communication system of claim 13, wherein the digital equalization filter includes N coefficients.

15. The communication system of claim 14, wherein the communication system includes a digital simulcast system.

16. The communication system of claim 15, wherein the measuring means includes means for exciting the anti-alias filter with a unit impulse.

17. The communication system of claim 16, wherein the measuring means includes means for measuring the impulse response of the anti-alias filter.

18. The communication system of claim 17, wherein the determining means includes means for computing a new set of N coefficients using the Levinson-Durbin algorithm.

19. The communication system of claim 18, including further means for determining when it is time to update the N coefficients.

20. The communication system of claim 19 wherein the measuring means include means responsive to said further determining means for further measuring the amount of the transmission parameter contributed to the output signal by the second filter;
the determining means include means responsive to said further determining means for further determining the characteristics of the first filter needed to compensate for the amount of the transmission parameter contributed to the output signal; and
the controlling means include means responsive to said further determining means for further controlling the first filter.

21. The communication system of claim 20, wherein the means for selectively controlling the first filter to achieve a desired amount of delay in the output includes a digital signal processor (DSP).

22. The communications system of claim 21, wherein the second filter is substantially fixed, and thus whose transmission parameters vary substantially by the process of aging and decay.

23. A digital simulcast system transmitter site having an input, and an output that is based on the characteristics of a digital equalization filter having N coefficients that may be selectively adjusted and on the characteristics of a second filter, the transmitter site including a processor arranged for adjusting the N coefficients to achieve a predetermined amount of delay in the output in accordance with a program comprising the following steps:
(a) measuring the amount of delay contributed to the output by the second filter;
(b) determining the values for the N coefficients of the digital equalization filter needed to compensate for the amount of delay measured in step (a);
(c) adjusting the values of the N coefficients filter based on the outcome in step (b).

24. The transmitter site of claim 23, wherein the second filter includes an analog anti-alias filter.

25. The transmitter site of claim 24, wherein the processor program measuring step (a) includes a step (a1) of exciting the analog anti-alias filter with a unit impulse.

26. The transmitter site of claim 25, wherein the processor program measuring step (a) includes a step (a2) of measuring the impulse response of the analog anti-alias filter.

27. The transmitter site of claim 26, wherein the processor program determining step (b) includes a step of computing a new set of N coefficients using the Levinson-Durbin algorithm.

28. The transmitter site of claim 27, wherein the processor program includes a further step of:
(d) determining when it is time to update the N coefficients.

29. The transmitter site of claim 28, wherein the processor program includes a further step of, based on the outcome of the further determining step (d), repeating the measuring step (a), the determining step (b), and the adjusting step (c).

30. The transmitter site of claim 29, wherein the processor includes a digital signal processor (DSP).

31. The transmitter site of claim 30, wherein the second filter is generally fixed, and thus not generally capable of being manually controlled other than by the effects of aging and decay.

* * * * *